US012261466B2

(12) United States Patent
Ito et al.

(10) Patent No.: US 12,261,466 B2
(45) Date of Patent: Mar. 25, 2025

(54) STORAGE BATTERY MONITORING DEVICE AND METHOD FOR MAINTAINING STORAGE BATTERY MONITORING DEVICE (71) Applicant: GS Yuasa International Ltd., Kyoto (JP)

(72) Inventors: Hirokazu Ito, Kyoto (JP); Yuya Kihira, Kyoto (JP); Kazuo Haruki, Kyoto (JP); Ibuki Watano, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 204 days.

(21) Appl. No.: 17/927,218

(22) PCT Filed: Apr. 14, 2021

(86) PCT No.: PCT/JP2021/015372
§ 371 (c)(1),
(2) Date: Nov. 22, 2022

(87) PCT Pub. No.: WO2021/241043
PCT Pub. Date: Dec. 2, 2021

(65) Prior Publication Data
US 2023/0223776 A1 Jul. 13, 2023

(30) Foreign Application Priority Data

May 26, 2020 (JP) ................... 2020-091187

(51) Int. Cl.
*G01R 31/36* (2020.01)
*H02J 7/00* (2006.01)
(52) U.S. Cl.
CPC .................. *H02J 7/0047* (2013.01)
(58) Field of Classification Search
None
See application file for complete search history.

(56) References Cited

U.S. PATENT DOCUMENTS

2010/0114512 A1\* 5/2010 Cotton ................. G01R 31/382
702/63
2016/0233560 A1 8/2016 Kanoh
(Continued)

FOREIGN PATENT DOCUMENTS

JP 2010-146991 A 7/2010
JP 2012-073740 A 4/2012
(Continued)

OTHER PUBLICATIONS

International Search Report and Written Opinion for International Application No. PCT/JP2021/015372, dated Jun. 15, 2021, (8 pages), Japan Patent Office, Tokyo, Japan.
(Continued)

*Primary Examiner* — John F Mortell
(74) *Attorney, Agent, or Firm* — Alston & Bird LLP (57) ABSTRACT

A storage battery monitoring device according to an aspect of the present invention includes: a plurality of monitoring units attached to a plurality of storage batteries connected in series and/or in parallel; and a management unit capable of wirelessly communicating with the plurality of monitoring units. The management unit sequentially selects identification information about the plurality of monitoring units stored previously, and transmits a connection request message including identification information about a selected monitoring unit to the plurality of monitoring units through wireless communication in order to establish communication with the selected monitoring unit. The management unit further updates identification information about another monitoring unit to identification information about one monitoring unit through the wireless communication when the another monitoring unit is replaced with the one monitoring unit.

8 Claims, 9 Drawing Sheets

System configuration (56) References Cited

U.S. PATENT DOCUMENTS

2020/0036194 A1  1/2020  Park
2022/0137142 A1  5/2022  Ito

FOREIGN PATENT DOCUMENTS

| JP | 2013-009531 A | 1/2013 |
| JP | 2014-072931 A | 4/2014 |
| JP | 2015-162967 A | 9/2015 |
| JP | 2015-181327 A | 10/2015 |
| JP |      6135767 B2 | 5/2017 |
| JP | 2018-201331 A | 12/2018 |
| JP | 2019-216598 A | 12/2019 |
| JP |      6690799 B1 | 4/2020 |
| JP | 2020512797 A | 4/2020 |

OTHER PUBLICATIONS

Office Action for Japanese Patent Application No. 2020-091187, submitted/dated May 14, 2024, 8 pages, Japanese Patent Office, Tokyo, Japan.

* cited by examiner

Fig. 1

System configuration

STORAGE BATTERY MONITORING DEVICE AND METHOD FOR MAINTAINING STORAGE BATTERY MONITORING DEVICE

CROSS REFERENCE TO RELATED APPLICATIONS

This application is a National Stage Application, filed under 35 U.S.C. § 371, of International Application No. PCT/JP2021/015372, filed Apr. 14, 2021, which international application claims priority to and the benefit of Japanese Application No. 2020-091187, filed May 26, 2020; the contents of both of which are hereby incorporated by reference in their entirety.

BACKGROUND

Technical Field

The present invention relates to a storage battery monitoring device and a method for maintaining the storage battery monitoring device.

Description of Related Art

Patent Literature Japanese Patent No. 6135767 discloses that in an energy storage system, a relay board is communicably connected to a higher power control device and each lower storage battery board.

BRIEF SUMMARY

One aspect of the present invention provides a storage battery monitoring device using wireless communication and a method for maintaining the storage battery monitoring device.

A storage battery monitoring device according to an aspect of the present invention includes: a plurality of monitoring units attached to a plurality of storage batteries connected in series and/or in parallel; and a management unit capable of wirelessly communicating with the plurality of monitoring units. The management unit sequentially selects identification information about the plurality of monitoring units stored previously and transmits a connection request message including identification information about a selected monitoring unit to the plurality of monitoring units through wireless communication in order to establish communication with the selected monitoring unit. The management unit further updates identification information about another monitoring unit to identification information about one monitoring unit through the wireless communication when the another monitoring unit is replaced with the one monitoring unit.

According to another aspect of the present invention, a method for maintaining a storage battery monitoring device including a plurality of monitoring units attached to a plurality of storage batteries connected in series and/or in parallel and a management unit capable of wirelessly communicating with the plurality of monitoring units, the method for maintaining the storage battery monitoring device includes: replacing one monitoring unit with another monitoring unit; selecting identification information about the another monitoring unit on a touch panel included in the management unit to establish communication between the management unit and the another monitoring unit; and updating the identification information about the another monitoring unit to identification information about the one monitoring unit through the wireless communication on the touch panel included in the management unit.

According to the above aspect, when one monitoring unit (for example, a failed monitoring unit) is replaced with another monitoring unit (for example, a spare monitoring unit), the identification information can be easily updated.

DETAILED DESCRIPTION OF VARIOUS EMBODIMENTS

In an energy storage system, a large number of storage batteries are connected in series and/or in parallel. There is also a large-scale energy storage system including several hundred storage batteries. There is a growing need for remote monitoring of the individual storage battery in the large-scale energy storage system. In order to implement such storage battery monitoring, when a plurality of monitoring units attached to each of the storage batteries and a management unit that acquires data from the monitoring units are connected by wire, network laying cost increases.

There is a demand for a technique capable of implementing the remote monitoring of the storage battery while reducing wiring cost and communication cost.

Among short-range wireless communication standards, Bluetooth Low Energy (hereinafter, referred to as BLE) has attracted attention in IoT applications. Wireless communication can be performed at low cost with the BLE.

Hereinafter, an embodiment (lead-acid battery monitoring device) of a storage battery monitoring device will be described with reference to the drawings. The lead-acid battery monitoring device in FIG. 1 includes a plurality of sensor units (monitoring units) 20 attached to each of a plurality of lead-acid batteries 1 connected in series and/or in parallel and a control unit (management unit) 10 capable of wirelessly communicating with the plurality of sensor units 20.

Here, a plurality of lead-acid batteries 1 connected in series may be referred to as a bank, and a plurality of banks connected in parallel may be referred to as a domain.

Figure 1:
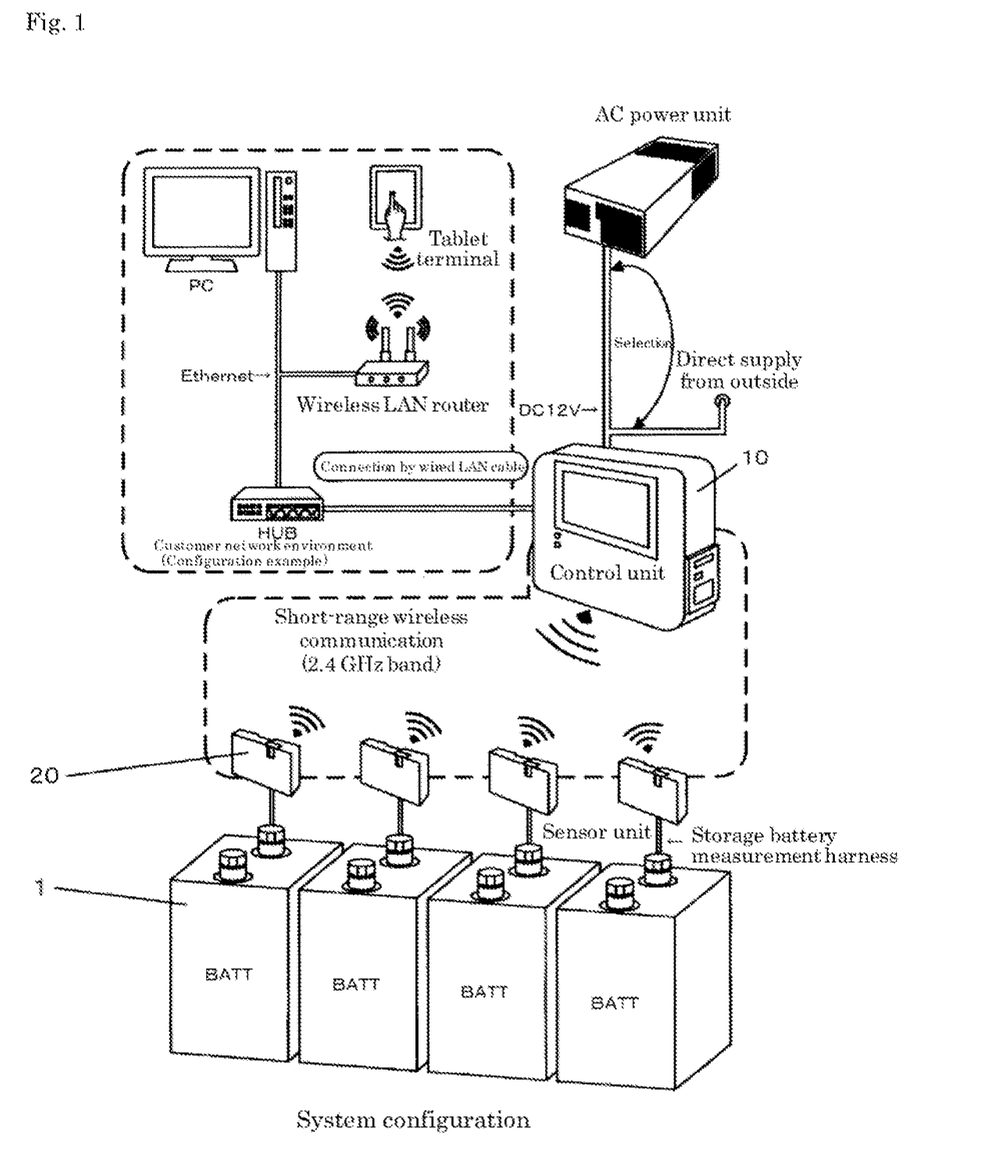
FIG. 1 is a view illustrating an outline of a storage battery monitoring device.

The control unit 10 and the plurality of sensor units 20 may be installed in a storage battery board storing a plurality of lead-acid batteries that is a monitoring target. For example, the control unit 10 is attached to an inside of an opening and closing lid of the storage battery board. The plurality of sensor units 20 are installed on the plurality of lead-acid batteries 1 arranged in the storage battery board.

The control unit 10 includes a web server function, and may receive access by a terminal such as a computer (PC) or a tablet connected to a network.

Figure 2:
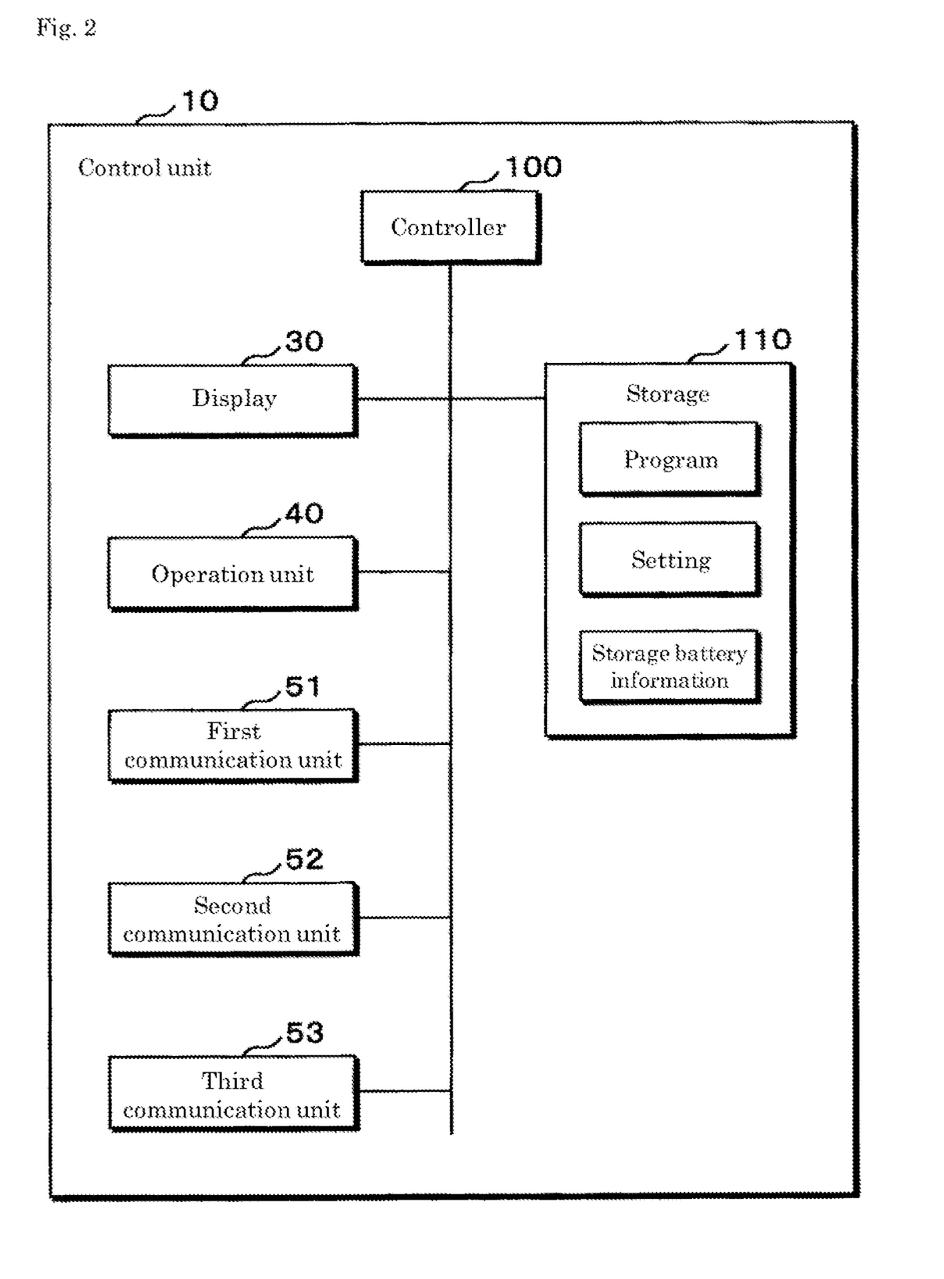
FIG. 2 is a block diagram illustrating a configuration of control unit.

FIG. 2 is a block diagram illustrating a configuration of the control unit 10. The control unit 10 includes a controller 100, a storage 110, a display 30, an operation unit 40, a first communication unit 51, a second communication unit 52, and a third communication unit 53.

The controller 100 includes a processor, and controls the first communication unit 51, the second communication unit 52, and the third communication unit 53 based on a program stored in the storage 110.

The storage 110 uses a nonvolatile memory. The storage 110 previously stores a program. The storage 110 stores a content set by an operation on a menu screen described later. The storage 110 stores storage battery information acquired by the controller 100.

For example, the display 30 is a liquid crystal panel. The operation unit 40 is a touch panel built in the liquid crystal panel. The operation unit 40 may include a physical button.

The first communication unit 51 is a wireless communication module that implements wireless communication connection with the sensor unit 20. The control unit 10 is communicably connected to the plurality of sensor units 20 by the first communication unit 51. The first communication unit 51 implements communication by BLE. The second communication unit 52 is a connection module connecting to a network of a customer (a customer who owns a power storage system such as a backup power supply by the lead-acid battery 1) in FIG. 1, and for example, is a network card corresponding to a wired LAN. The third communication unit 53 is a communication module that enables communication connection with a computer (PC) or a tablet terminal connected to a network. For example, the third communication unit 53 is a universal serial bus (USB).

Figure 3:
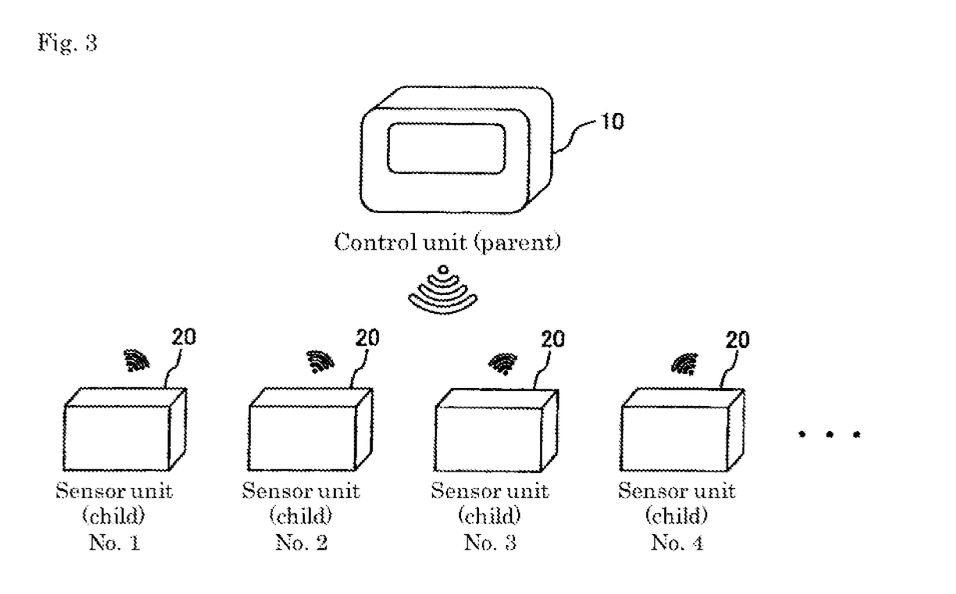
FIG. 3 is a schematic diagram illustrating communication between the control unit and a sensor unit.

FIG. 3 is a schematic diagram illustrating communication between the control unit 10 and the sensor unit 20. The message broadcasted from the control unit 10 to the plurality of sensor units 20 includes identification information about the specific sensor unit 20.

The message may include a MAC address storage and a message body. The identification information about the specific sensor unit 20 may be stored in the MAC address storage.

The control unit 10 includes a web server function, and produces screen data for screen display including an icon representing an overall state of the plurality of lead-acid batteries 1.

Figure 4:
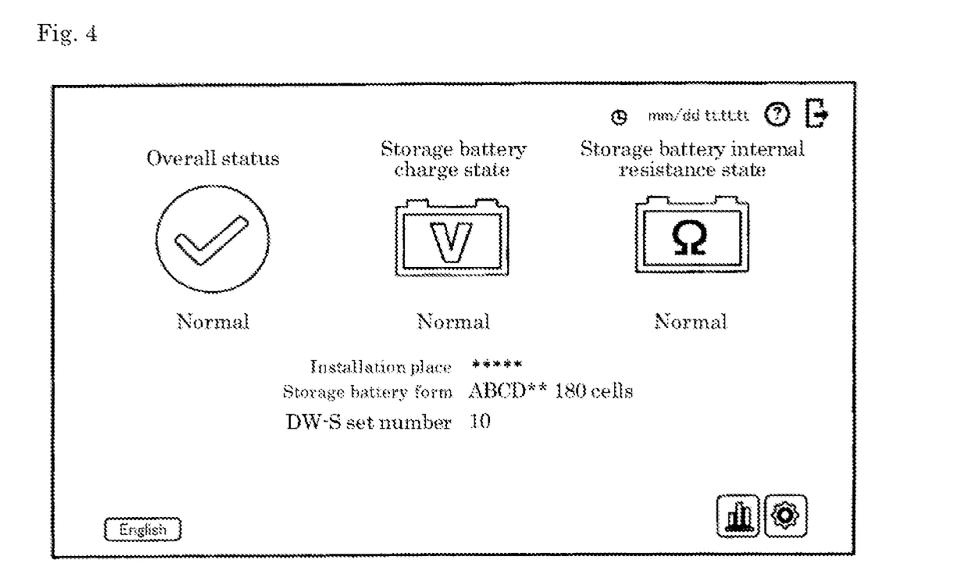
FIG. 4 is a view illustrating a remote monitoring screen on a web browser.

FIG. 4 illustrates an example of a remote monitoring screen displayed on a web browser terminal connected to the network of the control unit 10. The remote monitoring screen includes an icon for an overall status, an icon for a storage battery voltage state, and an icon for a storage battery internal resistance state.

In addition to the icon indicating "normal", an icon indicating "caution" or an icon indicating "warning" may be prepared as the icon for the overall status. Similarly, the icon indicating "caution" or "warning" may be prepared for the icon for the storage battery voltage state and the icon for the storage battery internal resistance state.

In the above-described lead-acid battery monitoring apparatus, identification information about the specific sensor unit 20 is included in the message broadcasted from the control unit 10 to the plurality of sensor units 20, and the communication between the control unit 10 and the specific sensor unit 20 is established using the identification information.

Accordingly, even when several hundred sensor units 20 associated with several hundred lead-acid batteries 1 are provided as in a power storage system having a storage battery group in the form of a domain including a plurality of banks, the control unit 10 can reliably acquire monitoring data sequentially from the sensor units 20.

In the lead-acid battery monitoring device, the sensor unit 20 and the control unit 10 are installed on the same storage battery board. The lead-acid battery monitoring device can be relatively easily attached (retrofitted) to an existing storage battery board in which the monitoring device is not included.

The sensor unit 20 wirelessly transmits monitoring data of the voltage, internal resistance, and temperature of the lead-acid battery 1, to which the sensor unit 20 is connected, to the control unit 10. Thus, a health condition (SOH) of the lead-acid battery 1 can be monitored.

The control unit 10 may determine the overall state by comparing the monitoring data (numerical data) of the plurality of lead-acid batteries 1 with a threshold or performing statistical processing.

The lead-acid battery 1 can be remotely monitored by a web browser of a terminal connected to the control unit 10 by LAN. The icon representing the overall state of the plurality of lead-acid batteries 1 facilitates a grasp of the state of the power storage system.

Figure 5:
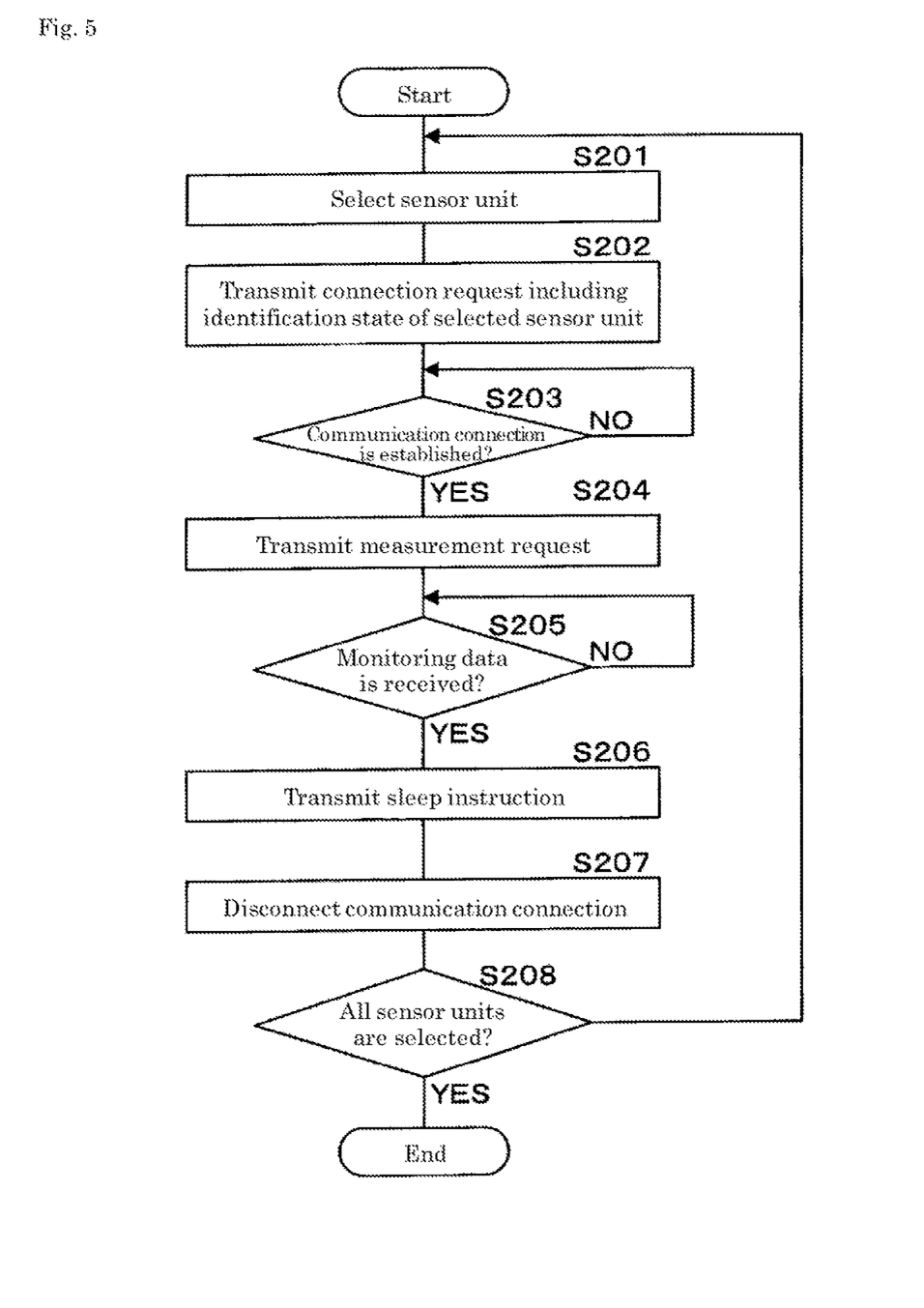
FIG. 5 is a flowchart illustrating an example of a processing procedure in the control unit.

FIG. 5 is a flowchart illustrating an example of a processing procedure in the control unit 10. The control unit 10 executes the following processing in units of banks at predetermined timing (for example, once a day). The control unit 10 sequentially executes the processing for all the banks. The control unit 10 stores timing for executing the following processing and identification information about the sensor unit 20 of a connection target in an internal memory.

The control unit 10 selects one piece of identification information about the sensor unit 20 (step S201). The control unit 10 transmits a connection request message including the selected identification information by BLE (step S202), and determines whether a communication connection (pairing) with the sensor unit 20 of the selected identification information is established (step S203). A connection request may be transmitted from the control unit 10 at timing different from normal monitoring (measurement), which will be described later.

When it is determined in step S203 that the communication connection is established (YES in S203), the control unit 10 transmits a measurement request to the sensor unit 20 connected for communication (step S204), and determines whether the monitoring data obtained by the measurement in response to the measurement request can be received (step S205).

When it is determined that the monitoring data can be received (YES in S205), the control unit 10 transmits a sleep instruction to the sensor unit 20 connected for communication (step S206), disconnects the communication connection (step S207), and advances the processing to next step S208.

The control unit 10 determines whether the pieces of identification information about all the sensor units 20 included in the target bank are selected (step S208). When it is determined that not all the items are selected (NO in S208), the control unit 10 returns the processing to step S201, and selects the identification information about the next sensor unit 20.

When it is determined that all the banks are selected (YES in S208), the control unit 10 ends the pieces of processing for the banks.

When it is determined in step S203 that the communication connection is not established (NO in S203), the control unit 10 returns the processing to step S203 and stands by. The control unit 10 makes a trial a predetermined number of times in a predetermined standby time, and advances the processing to step S207 when the communication cannot be established.

When it is determined in step S205 that the reception cannot be performed (NO in S205), the control unit 10 returns the processing to step S205 and stands by. The control unit 10 makes a trial a predetermined number of times in a predetermined standby time, and advances the processing to step S207 when data cannot be received.

Figure 6:
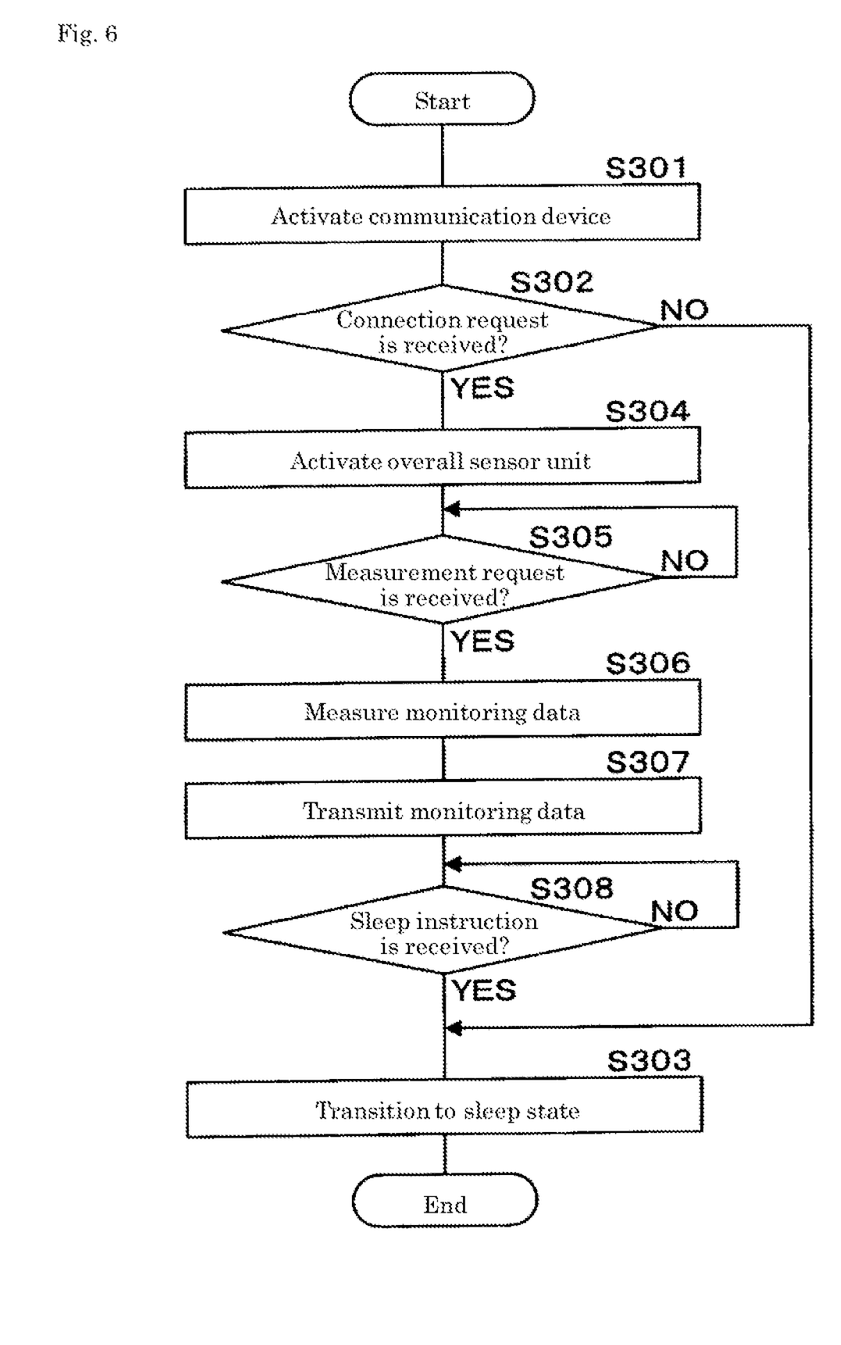
FIG. 6 is a flowchart illustrating an example of a processing procedure in the sensor unit.

FIG. 6 is a flowchart illustrating an example of a processing procedure in the sensor unit 20. The sensor unit 20 activates the BLE communication device from the sleep state intermittently, for example, every two seconds or three seconds (step S301), and determines whether the connection request to itself is received (step S302).

When it is determined that the connection request is not received (NO in S302), the sensor unit 20 transitions to the sleep state again (step S303), and ends the processing.

When it is determined in step S302 that the connection request is received (YES in S302), the sensor unit 20 activates the overall sensor unit (step S304), and determines whether the measurement request is received (step S305). When it is determined that the measurement request is received (YES in S305), the sensor unit 20 measures the monitoring data of the voltage, the internal resistance, and the temperature in the lead-acid battery to which the own device is attached (step S306). The sensor unit 20 transmits the monitoring data obtained by the measurement to the control unit 10 as a response to the measurement request (step S307).

The sensor unit 20 determines whether a sleep instruction is received (step S308). When it is determined that the sleep instruction is received, the sensor unit 20 transitions to the sleep state (step S303), and ends the processing.

When it is determined in step S305 that the measurement request is not received (NO in S305), the sensor unit 20 returns the processing to step S305 and stands by. The sensor unit 20 makes a trial a predetermined number of times in a predetermined standby time, and advances the processing to step S303 when the measurement request cannot be received.

When it is determined in step S308 that the sleep instruction is not received (NO in S308), the sensor unit 20 returns the processing to step S308 and stands by. The sensor unit 20 makes a trial a predetermined number of times in a predetermined standby time, and advances the processing to step S303 when the sleep instruction cannot be received.

Figure 7:
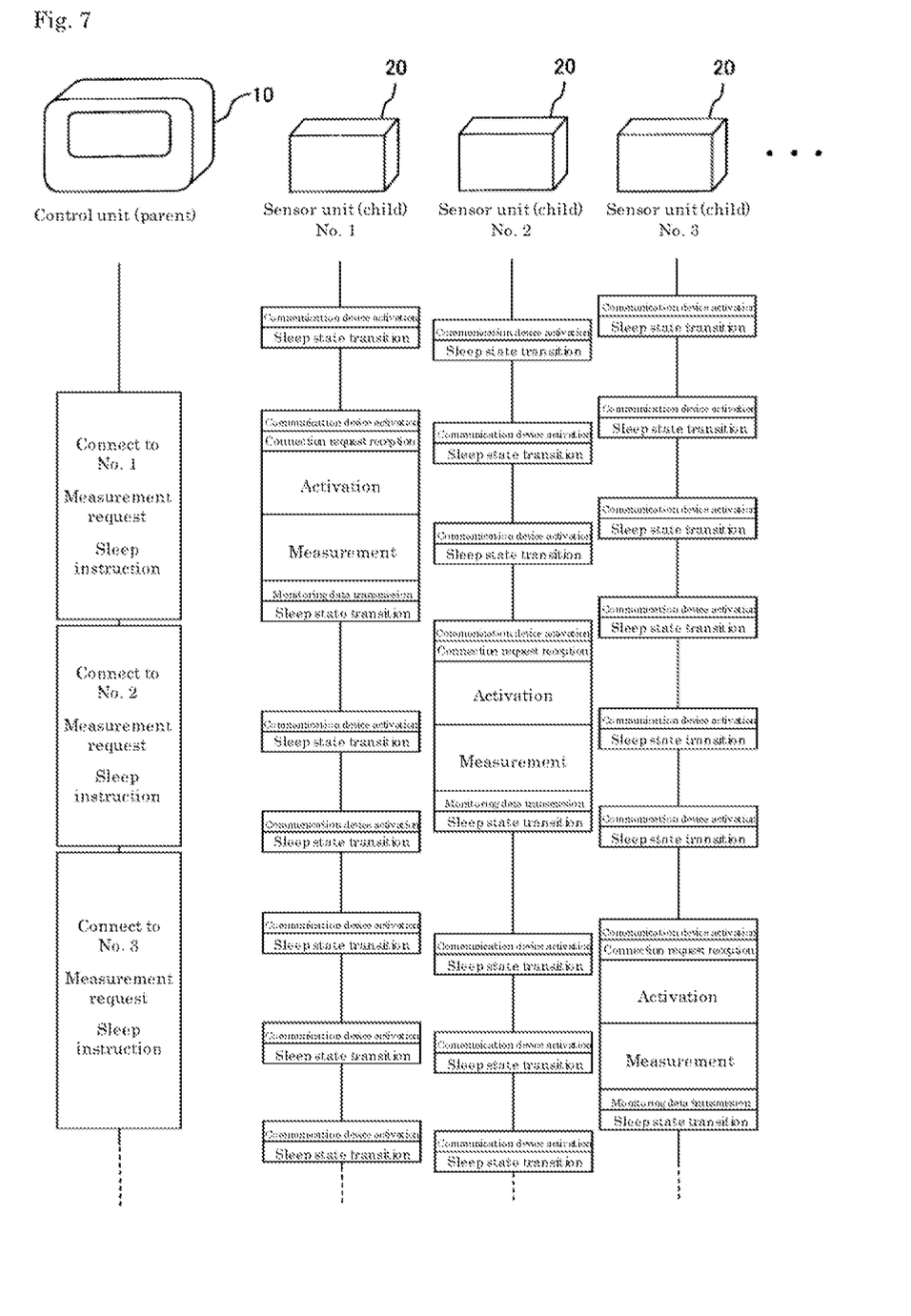
FIG. 7 is a schematic diagram illustrating a communication procedure.

FIG. 7 is a schematic diagram illustrating the communication procedure. FIG. 7 illustrates an activation time in the sensor unit 20 by the control unit 10 executing the procedure illustrated in the flowchart of FIG. 5 and the sensor unit 20 accordingly executing the procedure illustrated in the flowchart of FIG. 6. As illustrated in FIG. 7, the sensor unit 20 intermittently determines whether the connection request can be received by the communication device of BLE, measures the monitoring data of the lead-acid battery 1 to which the sensor unit is attached only when the connection request can be received, and wirelessly transmits the measured monitoring data to the control unit 10.

Figure 8:
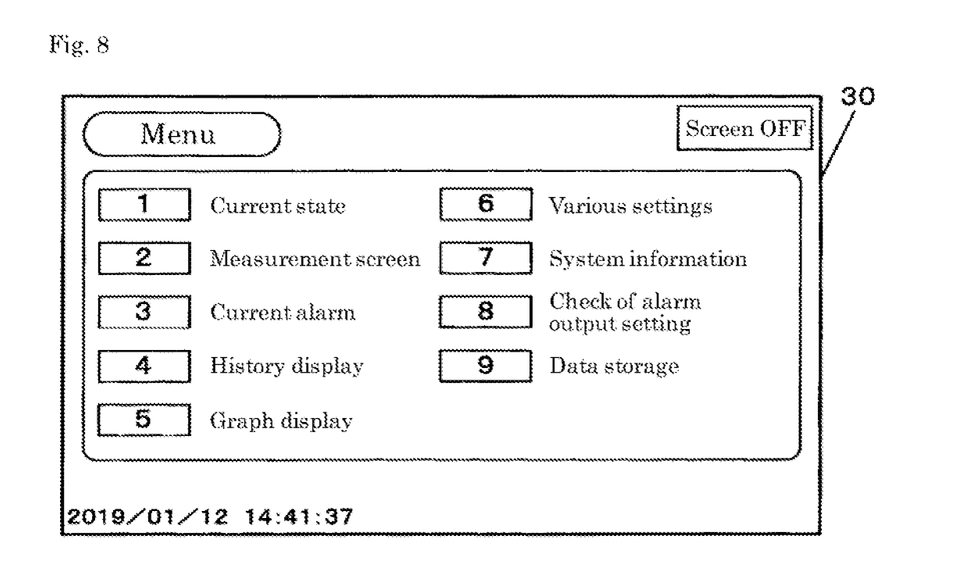
FIG. 8 is a view illustrating a menu screen of the storage battery monitoring device.

FIG. 8 illustrates a menu screen displayed on the display 30 of the control unit 10. The menu screen includes displays (icons) such as "1. Current state", "2. Measurement screen", "3. Current alarm", "4. History display", "5. Graph display", "6. Various settings", "7. System information", "8. Check of alarm output setting", and "9. Data storage". The menu screen may include the display (icon) of "screen OFF".

The lead-acid battery monitoring device issues an alarm when various abnormalities are generated. Specifically, in addition to the voltage and the internal resistance of the lead-acid battery 1 monitored by the sensor unit 20, when the temperature (temperature detected by a temperature sensor installed near the lead-acid battery 1) of the lead-acid battery 1 indicates an abnormal value, the lead-acid battery monitoring device issues an alarm.

In addition, the lead-acid battery monitoring device issues the alarm regarding an abnormality of the communication state between the sensor unit 20 and the control unit 10 or an abnormality of the sensor unit 20 itself.

When "3. Current alarm" in FIG. 8 is selected, the issued alarm can be checked.

When the alarm is issued for the sensor unit 20 and when it is found that the certain sensor unit 20 fails, the failed sensor unit is replaced with a spare sensor unit. A sensor unit initial ID is set as identification information in the spare sensor unit. The spare sensor unit may always have the same initial ID. For example, the initial ID is "0-N/A-0".

When "6. Various settings" in FIG. 8 is selected, the screen transitions to a screen that accepts various settings, and the screen can further transition to a screen of "sensor unit settings" in FIG. 9.

Figure 9:
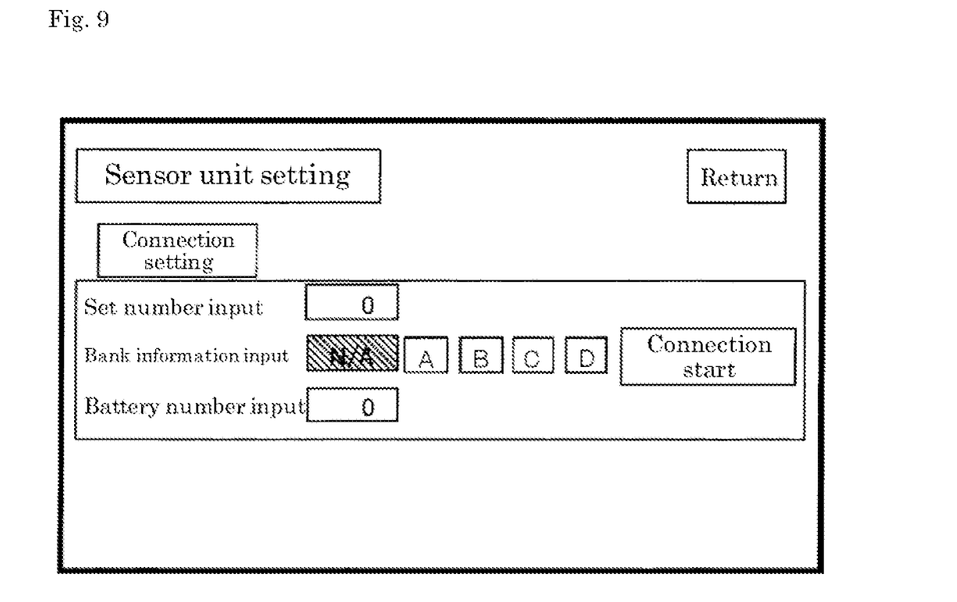
FIG. 9 is a view illustrating a screen updating identification information about the sensor unit.

In FIG. 9, "0" is displayed in a "set number input" field, "N/A" is displayed in a "bank information input" field, and "0" is displayed in a battery number input field. These indicate "0-N/A-0" that is the initial ID of the sensor unit 20.

At this point, a set number indicates a number (for example, a serial number) of the control unit 10. Bank information indicates any bank among a plurality of banks (A, B, C, D) managed by the control unit 10. A battery number indicates the serial order of the batteries in the bank.

Hereinafter, a description will be given regarding the case where the abnormality is generated in the sensor unit 20 attached to the lead-acid battery 1 of the series order 123 in the bank A, which is managed by the control unit 10 of the set number 123, and the sensor unit is replaced with a spare sensor unit. This is an example in which the connection request is transmitted from the control unit 10 at timing different from that at the time of normal monitoring (measurement).

First, a maintenance person (or a customer operator) visits the storage battery board, and attaches a spare sensor unit to the lead-acid battery 1 instead of the failed sensor unit 20. At this point, "123-A-123" is set as the identification information to the sensor unit 20 removed due to the failure, and "0-N/A-0" that is the initial ID is set to the spare sensor unit 20.

The maintenance person may store the identification information about the sensor unit in which the alarm is issued as the identification information about the removed sensor unit.

Next, as illustrated in FIG. 9, the maintenance person checks that "0" is displayed in the "set number input" field, "N/A" is displayed in the "bank information input" field, and "0" is displayed in the battery number input field on the display unit of the control unit 10, and then presses "connection start".

Figure 10:
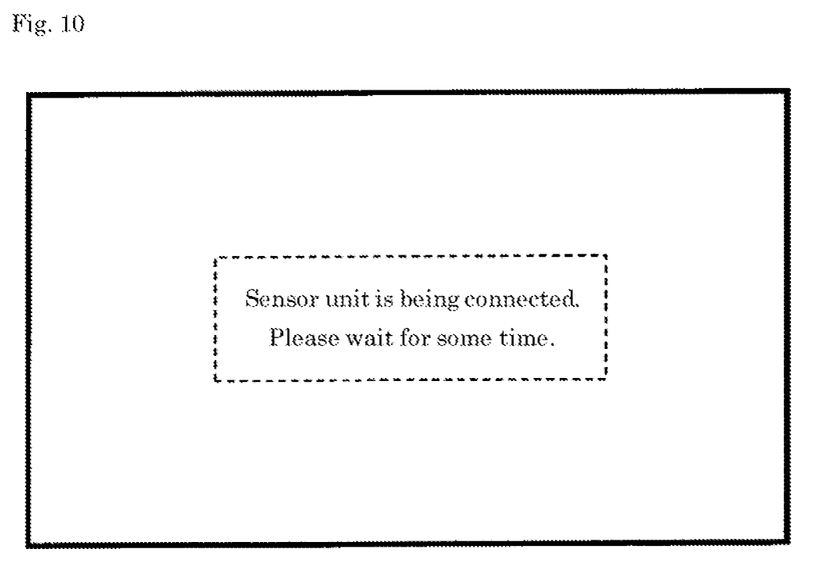
FIG. 10 is a view illustrating the screen updating the identification information about the sensor unit.

Thus, the control unit 10 transmits the connection request and starts an attempt to establish the communication connection with the sensor unit 20 in which the identification information is "0-N/A-0". Meanwhile, a screen as illustrated in FIG. 10 is displayed on the display of the control unit 10.

The connection request at this time is referred to as an ID setting request while distinguished from the connection request at the time of normal monitoring.

The ID setting request may include a first ID setting request (ID setting request 0) and a second ID setting request (ID setting request 1). When the sensor unit 20 in which the identification information is "0-N/A-0" receives the first ID setting request transmitted by the control unit 10, the display (a light emitting unit such as an LED) provided in the sensor unit 20 may notify the surroundings that the first ID setting request is received (for example, the LED may be turned on). Thus, the maintenance person can check that the spare sensor unit 20 attached to the lead-acid battery 1 starts the communication with the control unit 10.

Figure 11:
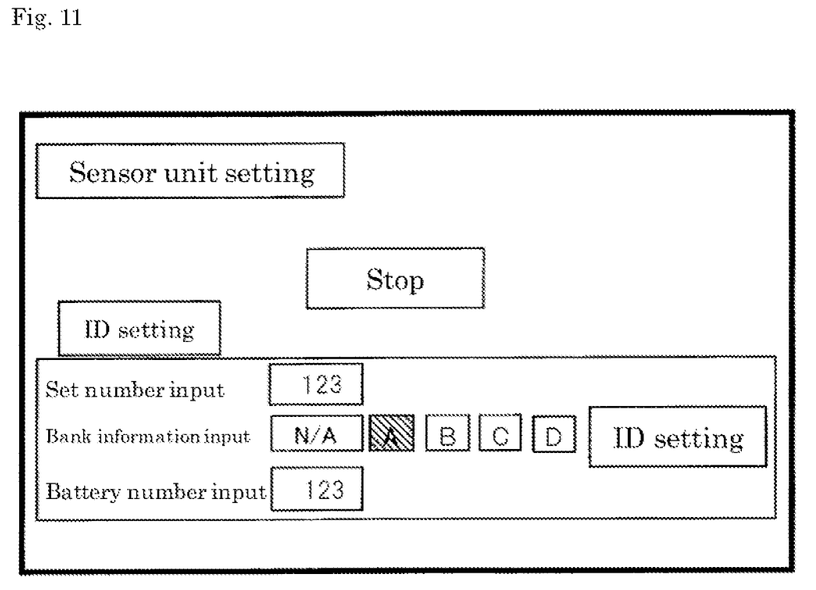
FIG. 11 is a view illustrating the screen updating the identification information about the sensor unit.

When the sensor unit 20 in which the identification information is "0-N/A-0" receives the second ID setting request transmitted by the control unit 10 and when the communication connection between the control unit 10 and the spare sensor unit 20 is established, the sensor unit 20 accepts the update of the identification information "0-N/A-0" of the spare sensor unit to the identification information "123-A-123" of the removed sensor unit by the input of the maintenance person on the screen in FIG. 11.

The maintenance person presses "ID setting" in FIG. 11.

Figure 12:
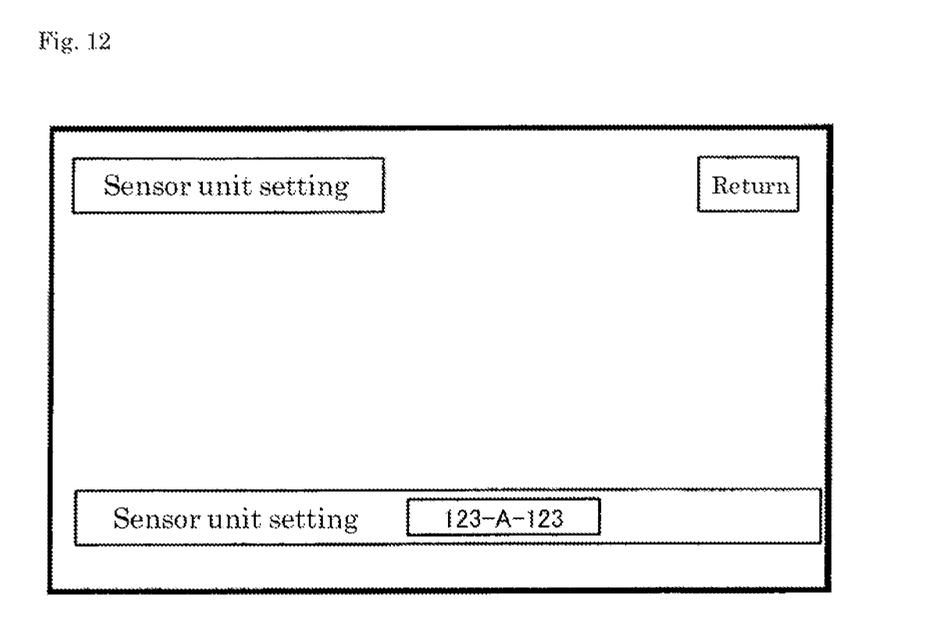
FIG. 12 is a view illustrating the screen updating the identification information about the sensor unit.

Accordingly, when the identification information of the spare sensor unit is updated to "123-A-123", the screen shifts to the screen in FIG. 12. "123-A-123" is displayed in the "sensor unit ID" field.

As described above, the lead-acid battery monitoring device of the embodiment includes the plurality of sensor units 20 attached to the plurality of lead-acid batteries 1 connected in series and/or in parallel and the control unit 10 capable of wirelessly communicating with the sensor units 20.

The control unit 10 performs the following steps. The pieces of identification information about the plurality of sensor units 20 previously stored are sequentially selected, and in order to establish the communication with the selected sensor unit 20, the connection request message including the identification information about the selected sensor unit is transmitted to the plurality of sensor units 20, and the measurement request of the monitoring data is transmitted to the sensor unit 20 in which the communication is established.

When receiving the connection request message to establish the communication with the control unit 10, each of the plurality of sensor units 20 measures the monitoring data of the lead-acid battery 1 to which the sensor unit 20 is attached in response to the reception of the measurement request, and wirelessly transmits the measured monitoring data to the control unit 10.

The control unit 10 further updates the identification information "0-N/A-0" about another sensor unit to the identification information "123-A-123" about one sensor unit when the one sensor unit (the sensor unit of which the identification information is "123-A-123") is replaced with another sensor unit (the sensor unit of which the identification information is "0-N/A-0").

At this point, the form "123-A-123" or "0-N/A-0" of the identification information is an example, and the identification information is not limited to this form but may simply be a serial number of the sensor unit 20.

With the above configuration, when one sensor unit (for example, the failed sensor unit) is replaced with another sensor unit (for example, the spare sensor unit), the identification information can be easily updated.

When the large-scale energy storage system including several hundred lead-acid batteries 1 is monitored, an abnormality generation probability of the sensor unit 20 increases as the number of sensor units 20 attached to each lead-acid battery 1 increases, and a frequency of the sensor unit replacement also increases. With the above configuration, a maintenance activity of the lead-acid battery monitoring device is significantly simplified. The setting of the sensor unit associated with the replacement work can be quickly changed while the operation of the energy storage system is continued (while the inconvenience and burden on the customer is minimized). The wireless communication connection between the control unit 10 and the spare sensor unit 20 is established by the connection procedure similar to that in the normal monitoring operation, the sensor unit ID is updated, and the normal monitoring operation can be resumed.

In the lead-acid battery monitoring device of the embodiment, the control unit 10 includes the touch panel display 30, and the touch panel display 30 displays a reception screen receiving the update of the identification information about the sensor unit 20.

Thus, the maintenance person who visits the storage battery board where the alarm is issued can replace the sensor unit 20 and update the identification information about the sensor unit 20 at the site without carrying various maintenance devices.

In the lead-acid battery monitoring device of the embodiment, the spare sensor unit 20 (not attached to the lead-acid battery 1) includes a unique sensor unit initial ID "0-N/A-0" before the identification information is updated by the control unit 10.

Thus, a part of the maintenance activity is made common, and the maintenance activity is further simplified. The situation in which the maintenance person erroneously performs work or forgets the sensor unit initial ID on site can be prevented before anything happens.

The above-described embodiment is an example, but the present invention is not limited thereto. The communication standard of the wireless communication to be used is not limited to BLE. The storage battery is not limited to the lead-acid battery, but may be a lithium ion battery or another secondary battery.

The maintenance person may remotely update the identification information about the sensor unit 20 without visiting the storage battery board. For example, the sensor unit replacement may be entrusted to a customer operator (first operator), and the maintenance person (second operator) may update the identification information about the sensor unit 20 from the terminal connected to the control unit 10 through the network.

The procedure in FIGS. 9 to 12 is not limited to the case of replacing the failed sensor unit 20, but may be performed to update the identification information about the sensor unit in other situations. For example, when the storage battery monitoring device is newly installed in the energy storage system (battery board or the like), this procedure may be performed in order to change the identification information about the sensor unit 20 set to unintended identification information due to a setting error or the like to appropriate identification information.

The storage battery monitoring device in the above-described embodiment includes the following configuration.

A storage battery monitoring device includes: a plurality of monitoring units attached to a plurality of storage batteries connected in series and/or in parallel; and a management unit capable of wirelessly communicating with the plurality of monitoring units. The management unit sequentially selects identification information about the plurality of monitoring units stored previously, transmits a connection request message including identification information about a selected monitoring unit to the plurality of monitoring units through wireless communication in order to establish communication with the selected monitoring unit, and transmits a measurement request of monitoring data to the monitoring unit in which the communication is established, each of the plurality of monitoring units measures the monitoring data of the storage battery to which the monitoring unit is attached in response to reception of the measurement request to wirelessly transmit measured monitoring data to the management unit when receiving the connection request message to establish the communication with the management unit, and the management unit further updates identification information about another monitoring unit to identification information about one monitoring unit through the wireless communication when the one monitoring unit is replaced with the another monitoring unit.

That is, in the above-described embodiment, each of the monitoring units measures the monitoring data of the storage battery in response to reception of the measurement request transmitted from the management unit.

Alternatively, the monitoring unit may autonomously measure the monitoring data of the storage battery without waiting for the measurement request from the management unit. As an event (for example, at a predetermined period), the monitoring unit may measure the monitoring data of the storage battery to which the monitoring unit is attached, and wirelessly transmit the measured monitoring data to the management unit.

The invention claimed is:

1. A storage battery monitoring device comprising:
    a plurality of monitoring units attached to a plurality of storage batteries connected in series and/or in parallel; and
    a management unit capable of wirelessly communicating with the plurality of monitoring units,
    wherein the management unit:
        sequentially selects identification information about the plurality of monitoring units stored previously,
        transmits a connection request message including identification information about a selected monitoring unit to the plurality of monitoring units through wireless communication in order to establish communication with the selected monitoring unit, and
        replaces, via the wireless communication, identification information about another monitoring unit with identification information about one monitoring unit when the one monitoring unit is replaced with the another monitoring unit, such that the identification information about the one monitoring unit is reassigned to the another monitoring unit.

2. The storage battery monitoring device according to claim 1, wherein:
    the management unit includes a touch panel display, and the touch panel display displays a reception screen receiving update of the identification information about the another monitoring unit to the identification information about the one monitoring unit.

3. The storage battery monitoring device according to claim 1, wherein the another monitoring unit includes a monitoring unit initial ID as the identification information before the update performed by the management unit.

4. The storage battery monitoring device according to claim 1, wherein the management unit receives the update of the identification information about the another monitoring unit to the identification information about the one monitoring unit from a terminal network-connected to the management unit.

5. A method for maintaining a storage battery monitoring device including a plurality of monitoring units attached to a plurality of storage batteries connected in series and/or in parallel and a management unit capable of wirelessly communicating with the plurality of monitoring units, the method for maintaining a storage battery monitoring device comprising:
    replacing one monitoring unit with another monitoring unit;
    selecting identification information about the another monitoring unit on a touch panel included in the management unit to establish communication between the management unit and the another monitoring unit; and
    replacing, via the touch panel and through the wireless communication, the identification information about the another monitoring unit with identification information about the one monitoring unit, such that the identification information about the one monitoring unit is reassigned to the another monitoring unit.

6. The storage battery monitoring device according to claim 2, wherein the another monitoring unit includes a monitoring unit initial ID as the identification information before the update performed by the management unit.

7. The storage battery monitoring device according to claim 2, wherein the management unit receives the update of the identification information about the another monitoring unit to the identification information about the one monitoring unit from a terminal network-connected to the management unit.

8. The storage battery monitoring device according to claim 3, wherein the management unit receives the update of the identification information about the another monitoring unit to the identification information about the one monitoring unit from a terminal network-connected to the management unit.

* * * * *